United States Patent [19]

Feldbaumer et al.

[11] Patent Number: 5,012,126
[45] Date of Patent: Apr. 30, 1991

[54] HIGH SPEED CMOS MULTIPLEXER HAVING REDUCED PROPAGATION DELAY

[75] Inventors: David W. Feldbaumer, Chandler; Barry B. Heim, Mesa, both of Ariz.

[73] Assignee: Motorola, Inc., Schaumburg, Ill.

[21] Appl. No.: 533,206

[22] Filed: Jun. 4, 1990

[51] Int. Cl.$^5$ .............................................. G06F 3/14
[52] U.S. Cl. .................................. 307/243; 307/243; 307/451; 307/584; 307/585
[58] Field of Search ................ 307/243, 451, 584, 585

[56] References Cited

U.S. PATENT DOCUMENTS 4,019,178  4/1977  Hashimoto et al. ................ 307/585

OTHER PUBLICATIONS

CMOS: Higher speeds, more drive and analog capability expand its horizons, Electronic Design 23, Nov. 8, 1978, David Bingham.
A COS/MOS Dual NAND Buffer Circuit, Blandford, Gimber, Electronics Industry, Jul. 1978.

Primary Examiner—Stanley D. Miller
Assistant Examiner—Scott A. Ouellette
Attorney, Agent, or Firm—Michael D. Bingham; Robert D. Atkins

[57] ABSTRACT

A CMOS multiplexing circuit is provided for selecting one of a plurality of input signals under control of a digital select signal for providing an output signal inverted with respect to the selected input signal. A plurality of processing channels one for each input signal and each having exactly first, second, third and fourth transistors serially connected between first and second sources of operating potential are repsonsive to the digital select signal whereby only the second and third transistors in the selected processing channels are enabled. The other processing channels supporting the remaining input signals are disabled. The first and fourth transistors of the selected processing channel are alternately enabled by one of the plurality of input signals for providing the inverse state thereof at the output formed at the interconnection of the second and third transistors. The first and second sources of operating potential need pass through only two transistors which improves the propagation delay and since only the second and third transistors of the selected processing channels are conducting, the transistors forming the remaining non-selected processing channels are effectively removed from the output terminal thereby reducing the capacitive load thereon and improving the propagation delay in the select path.

20 Claims, 2 Drawing Sheets

HIGH SPEED CMOS MULTIPLEXER HAVING REDUCED PROPAGATION DELAY

BACKGROUND OF THE INVENTION

This invention relates in general to multiplexer circuits, and more particularly, to a high speed CMOS multiplexer circuit having reduced propagation delay in the data path and selected path.

A multiplexing circuit is a common and useful component of many modern digital systems wherein there is a need to select between one of a plurality of input signals under control of a digital select signal. For example, in a four-to-one digital multiplexer, four digital input signals are applied at four data inputs while 2-bit digital select signal is applied at the select inputs thereof. The four possible combinations of the 2-bit digital select signal propagates the inverse state of the selected digital input signal to the output terminal. Other multiplexing circuits can accommodate a greater number of input signals with additional select bits. For example, an eight-to-one multiplexer requires a 3-bit digital select signal and a sixteen-to-one multiplexer uses a 4-bit digital select signal.

The conventional multiplexing circuit comprises a parallel combination of processing channels, one for each input signal, coupled between a positive source of operating potential such as $V_{CC}$ and a ground potential terminal. Each processing channel typically includes at least six serially couple CMOS transistors, three upper P-channel CMOS transistors, and three lower N-channel CMOS transistors. The drain of the lower P-channel CMOS transistor and the drain of the highest N-channel CMOS transistor in each conduction channel are coupled together to the output node. The gates of the CMOS transistors are coupled for receiving the digital select signals and input signals such that the digital select signal enables four of the six serially coupled transistors in one conduction path while the data input signal enables one of the remaining two transistors whereby either the three upper P-channel CMOS transistors or the three lower N-channel CMOS transistors are conducting. The output terminal is thus pulled toward $V_{CC}$ or ground potential through the three upper transistors or the three lower transistors depending on the digital input signal for providing the inverse state thereof.

The aforedescribed conventional multiplexer circuit includes a propagation delay through the six transistor conduction paths wherein the positive supply $V_{CC}$ or ground potential must pass through the three upper P-channel CMOS transistors or the three lower N-channel CMOS transistors, respectively, to reach the output terminal. The drain-to-source resistance and the ever present junction capacitance of each transistor creates an undesirable RC time constant for the propagating signal. Hence, the greater the number of transistors in a conduction path, the greater resistance and capacitance and associated propagation delay therethrough. Thus, it would be desirable to reduce the number of transistors in the data conduction path for each processing channel of the multiplexer.

Another concern in achieving reduced propagation delay through the multiplexer circuit is the parasitic drain capacitances associated with the P+ diffusion to N− bulk junction of the P-channel CMOS transistors and the N+ diffusion to P− bulk junction of the N-channel CMOS transistors. Theses junction capacitances are affixed to the output terminal at the junction of the lowest P-channel CMOS transistor and the highest N-channel CMOS transistor. Depending on the state of the digital input signals, it is common for the P-channel CMOS and N-channel CMOS transistors on either side of the output terminal in the non-selected processing channels to be conducting thereby adding the parasitic junction capacitances of the P-channel and N-channel CMOS transistors next in line in the conduction paths which serves to further load the output terminal slowing the charge and discharge rate thereof and increasing the propagation delay through the multiplexer circuit.

Previous attempts at speeding up the multiplexer circuit have included increasing size of the CMOS transistors for increasing the drive capacity thereof. This technique is often ineffective since the increase in size of the CMOS transistors also increases the parasitic drain capacitance of each transistor connected to the output terminal of which only one is attempting to drive the capacitive load. To maintain symmetry it is necessary to increase the size of all the CMOS transistors equally effectively increasing the parasitic drain capacitance by a factor of four and defeating the attempt at higher speed by driving the capacitive loads harder. A more desirable approach would be to reduce the capacitive load on the output terminal rather than drive it with additional power.

Hence, what is needed is an improved CMOS multiplexing circuit having fewer transistors in the conduction paths of each processing channel while reducing the capacitive load on the output terminal.

SUMMARY OF THE INVENTION

Accordingly, an objective of the present invention is to provide an improved CMOS multiplexing circuit.

Another object of the present invention is to provide an improved CMOS multiplexing circuit having only four transistors in the conduction path of each processing channel.

Still another objective of the present invention is to provide an improved CMOS multiplexing circuit having a reduced capacitive load on the output terminal.

In accordance with the above and other objectives there is provided an improved CMOS multiplexer circuit for selecting one of a plurality of input signals under control of a digital select signal for providing an output signal inverted with respect to the selected input signal comprising a plurality of processing channels each having exactly first, second, third and fourth transistors serially coupled between first and second sources of operating potential, wherein the first transistor is coupled to the first source of operating potential while the second transistor is coupled between the first transistor and the output. The third transistor is also coupled to the output, while the fourth transistor is coupled between the third transistor and the second source of operating potential. The first and fourth transistors are alternately enabled by one of the plurality of input signals. A selector circuit responsive to the digital select signal and having a plurality of outputs for providing a plurality of output signals enables the second and third transistors of one of the plurality of processing channels while disabling the second and third transistors of the other ones of the plurality of processing channels, thus completing a path in the selected processing channel between the output terminal and the first or second source of operating potential for providing the inverse state of the selected input signal.

DETAILED DESCRIPTION OF THE PREFERRED EMBODIMENT

Figure 1:
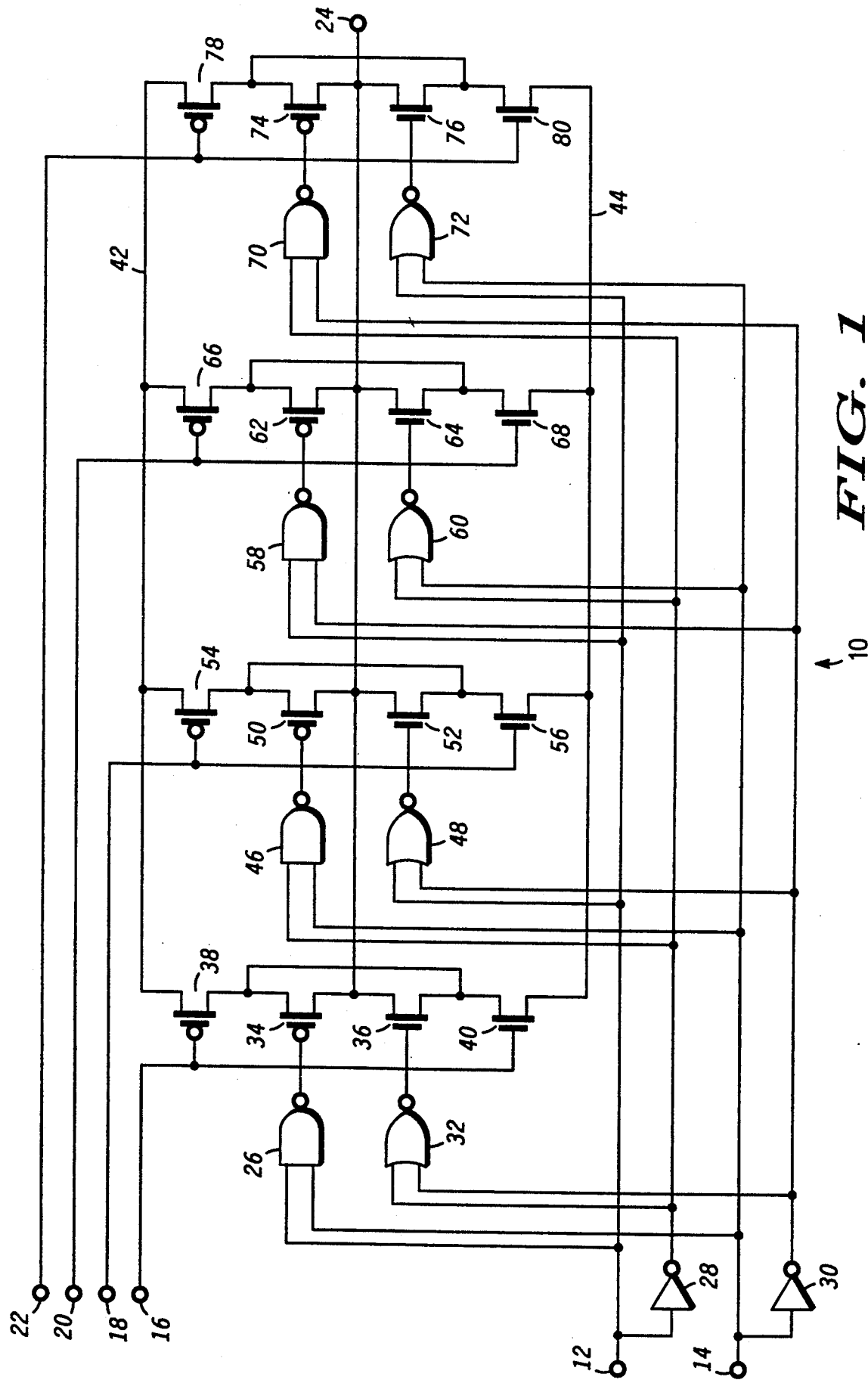
FIG. 1 is a schematic diagram illustrating the preferred embodiment of the present invention.

There is shown in FIG. 1 multiplexer 10 suitable for manufacturing in monolithic integrated form using conventional integrated circuit processes. Multiplexer 10 is responsive to a two-bit digital select signal applied at inputs 12 and 14 for selecting one of the four digital input signals applied at inputs 16, 18, 20, and 22, the inverse of which appears at output terminal 24. Inputs 12 and 14 are coupled to the first and second inputs of NAND gate 26 and through inverters 28 and 30 to the first and second inputs of NOR gate 32. The output of NAND gate 26 is coupled to the gate of P-channel CMOS transistor 34, and the output of NOR gate 32 is coupled to the gate of N-channel CMOS transistor 36. The gates of transistors 38 and 40 are coupled to input 16 while the source of transistor 38 is coupled to power supply conductor 42 operating at a positive potential such as $V_{CC}$. The drain of transistor 38 is coupled to the source of transistor 34, and the drains of transistors 34 and 36 are coupled together to output terminal 24. The source of transistor 36 and the drain of transistor 40 are coupled together to the source of transistor 34, and the source of transistor 40 is coupled to power supply conductor 44 typically operating at ground potential. Hence, transistors 34, 36, 38, and 40 are serially coupled in a conduction path formed between power supply conductors 42 and 44 for processing the first digital input signal applied at input 16.

The second processing channel comprises NAND gate 46, NOR gate 48, and transistors 50, 52, 54, and 56 for selecting the second digital input signal applied at input 18. The first and second inputs of NAND gate 46 are coupled to the output of inverter 28 and input 14, respectively, and the first and second inputs of NOR gate 48 are coupled to input 12 and the output of inverter 30. The outputs of NAND gate 46 and NOR gate 48 are coupled to the gates of transistors 50 and 52, respectively, while the gates of transistors 54 and 56 are coupled to input 18. The source of transistor 54 is coupled to power supply conductor 42 and the drain of the same is coupled to the source of transistor 50. The drains of transistors 50 and 52 are coupled together to output terminal 24, and the source of transistor 52 and the drain of transistor 56 are coupled together to the source of transistor 50. The source of transistor 56 is coupled to power supply conductor 44.

A third processing channel comprises NAND gate 58, NOR gate 60, and transistors 62, 64, 66, and 68 serially coupled between power supply conductor 42 and 44 for processing the third digital input signal applied at input 20. The first and second inputs of NAND gate 58 are coupled to input 12 and the output of inverter 30, respectively, and the first and second inputs of NOR gate 60 are coupled to the output of inverter 28 and input 14. The output of NAND gate 58 and NOR gate 60 are coupled to the gates of transistors 62 and 64, respectively, and the gates of transistors 66 and 68 are coupled together to input 20. The source of transistor 66 is coupled to power supply conductor 42 and the drain of transistor 66 is coupled to the source of transistor 62. The drains of transistors 62 and 64 are coupled together to output terminal 24, and the source of transistor 64 and the drain of transistor 68 are coupled together to the source of transistor 62, while the source of transistor 68 is coupled to power supply conductor 44.

The fourth processing channel comprises NAND gate 70, NOR gate 72, and transistors 74, 76, 78, and 80 serially coupled between power supply conductors 42 and 44 for selecting the fourth digital input signal applied at input 22. The first and second inputs of NAND gate 70 are coupled to the output of inverter 28 and the output of inverter 30, respectively, and the first and second inputs of NOR gate 72 are coupled to inputs 12 and 14. The outputs of NAND gate 70 and NOR gate 72 are coupled to the gates of transistors 74 and 76, respectively, and the gates of transistors 78 and 80 are coupled to input 22. The source of transistor 78 is coupled to power supply conductor 42, and the drain of transistor 78 is coupled to the source of transistor 74. The drains of transistors 74 and 76 are coupled together to output terminal 24, and the source of transistor 76 and the drain of transistor 80 are coupled together to the source of transistor 74 while the source of transistor 80 is coupled to power supply conductor 44.

In FIG. 1, multiplexer 10 is shown as a four-to-one multiplexer responsive to the 2-bit digital select signal applied at select inputs 12 and 14 for selecting one of the four digital input signals applied at inputs 16, 18, 20 and 22 and providing the inverse state thereof at output terminal 24. A summary of the four-to-one operation of multiplexer 10 is provided in Table 1 as follows:

TABLE 1

| General Operation of Multiplexer 10 | |
|---|---|
| Select bits (inputs 12,14) | Logic state at output 24 |
| 0,0 | Inverse of fourth input signal (input 22) |
| 1,0 | Inverse of third input signal (input 20) |
| 0,1 | Inverse of second input signal (input 18) |
| 1,1 | Inverse of first input signal (input 16) |

Consider the first state of the 2-bit digital select signal "00" wherein logic zeroes are applied at inputs 12 and 14 yielding logic ones at the outputs of inverters 28 and 30. NAND gates 26, 46, and 58 each generate a logic one at the outputs thereof, turning off transistors 34, 50, and 62, respectively. The logic ones from inverters 28 and 30 applied at the first and second inputs of NAND gate 70 provide a logic zero at its output turning on transistor 74. Likewise, the output signals of NOR gates 32, 48, and 60 are logic zero turning off transistors 36, 52, and 64, while the first and second input signals of NOR gate 72 are logic zero via inputs 12 and 14, thus providing a logic one at the output thereof and turning on transistor 76. Of the transistors coupled to output terminal 24, only transistors 74 and 76 are conducting thereby enabling the fourth processing channel of multiplexer 10 which is also responsive to the fourth input signal applied at input 22. If the fourth input signal is logic zero, then transistor 78 turns on pulling output terminal 24 to a logic one via power supply conductor 42. Alternately, if the fourth input signal is logic one, transistor 80 is conducting and output terminal 24 is pulled to the logic zero of power supply conductor 44. Hence, the digital select signal "00" provides the inverse state of the fourth input signal at output terminal 24. The connection between the source of transistor 74 and the drain of transistor 880 is optional and serves to increase the switching speed of transistors 74 and 76 by precharging the disabled node. The like connections in the other processing channels performs a similar function.

For a logical state of "10" applied at inputs 12 and 14, respectively, NAND gate 58 receives the logic one signals at its first and second inputs via input 12 and the output of inverter 30 thereby developing a logic zero at the output thereof and turning on transistor 62. Likewise, logic zeroes from the output of inverter 28 and input 14 are applied at the first and second input terminal of NOR gate 60 driving its output high turning on transistor 64. NAND gates 26, 46, and 70 each have at least one logic zero applied at the first and second inputs thereof which provides a logic one at the outputs turning off transistors 34, 50, and 74. NOR gates 32, 48, and 72 each have at least one logic one applied at the first and second inputs thereof which provide the logic zero at the output turning off transistors 36, 52, and 76, respectively. With transistors 62 and 64 conducting in the third processing channel, the state of the third input signal applied at input 20 is either low which selects transistor 66 pulling output terminal 24 high or it is high turning on transistor 68 and pulling output terminal 24 low, thus providing the inverse state of the third input signal at output terminal 24.

Now consider the logic state of "01" for the digital select signal applied at inputs 12 and 14, respectively. NAND gate 46 receives the logic one signals at its first and second inputs via the output of inverter 28 and input 14 thereby providing a logic zero at its output and turning on transistor 50. The logic zeroes applied at the first and second inputs of NOR gate 48 drive its output high to turn on transistor 52. NAND gates 26, 58, and 70 each have at least one logic zero applied at the first and second inputs thereof which yields a logic one at the outputs turning off transistors 34, 62, and 74, while NOR gates 32, 60, and 72 each have at least one logic one applied at the first and second inputs thereof to turn off transistors 36, 64, and 76, respectively. The state of the second input signal applied at input 18 is either low which selects transistor 54 pulling output terminal 24 high or it is high turning on transistor 56 and pulling output terminal 24 low.

For the logic state of "11" of the digital select signal applied at inputs 12 and 14, respectively, NAND gate 26 receives the logic one signals at its first and second inputs via inputs 12 and 14 thereby developing a logic zero at its output turning on transistor 34. The logic zeroes from the outputs of inverters 28 and 30 applied at the first and second input terminals of NOR gate 32 drive its output high to turn on transistor 36. NAND gates 46, 58, and 70 each have at least one logic zero applied at the first and second inputs thereof which provides a logic one at the outputs turning off transistors 50, 62, and 74, while NOR gates 48, 60, and 72 each have at least one logic one applied at the first and second inputs thereof to turn off transistors 52, 64, and 76, respectively. The state of the first input signal applied at input 16 is either low which selects transistor 38 pulling output terminal 24 high or it is high turning on transistor 40 and pulling output terminal 24 low. Hence, the digital select signal enables one of the four processing channels whereby output terminal 24 is driven to the opposite logic state as the associated digital input signal.

Multiplexer 10 may be easily expanded, typically in powers of two, with additional select bits and processing channels such as transistors 34-40, NAND gate 26 and NOR gate 32. For example, an eight-to-one multiplexer would comprise eight processing channels (four more than shown in FIG. 1) and one additional select bit along with its inverse such as provided by inverters 28 and 30. The NAND and NOR gates would each include three inputs coupled to the three select lines and inverses thereof such that only one of the P-channel transistor and N-channel transistor pairs common to output terminal 24 is active for the unique select bit combination.

Notice one of the important features of the present invention wherein the serially coupled transistor conduction path of each processing channel is only four transistors long. This reduces the data path propagation delay over the conventional multiplexer circuit comprising six or more transistors in the processing channel since the power supply potential $V_{CC}$ or the ground potential need propagate through only two transistors instead of the three transistors in the prior art thus reducing the path resistance and propagation delay. The propagation delay through the select path is also reduced since the digital select signal is switching two transistors instead of the four select enabling transistors as described in the background. Furthermore as described above, only the transistors common to output terminal 24 in the selected processing channel are conducting. The transistors common to output terminal 24 in the non-selected channel, e.g., transistors 50-52, 62-64 and 74-76 for digital select signal "11", are not conducting, hence, the parasitic drain capacitances associated with outside transistors 54-56, 66-68 and 78-80 are not loading output terminal 24. Moreover, since capacitive loading of the outside transistors in the non-conducting transistor paths is not a factor, the size of the CMOS transistors may be enlarged for increasing the drive capacity thereof and improving the switching speed of multiplexer 10.

Figure 2:
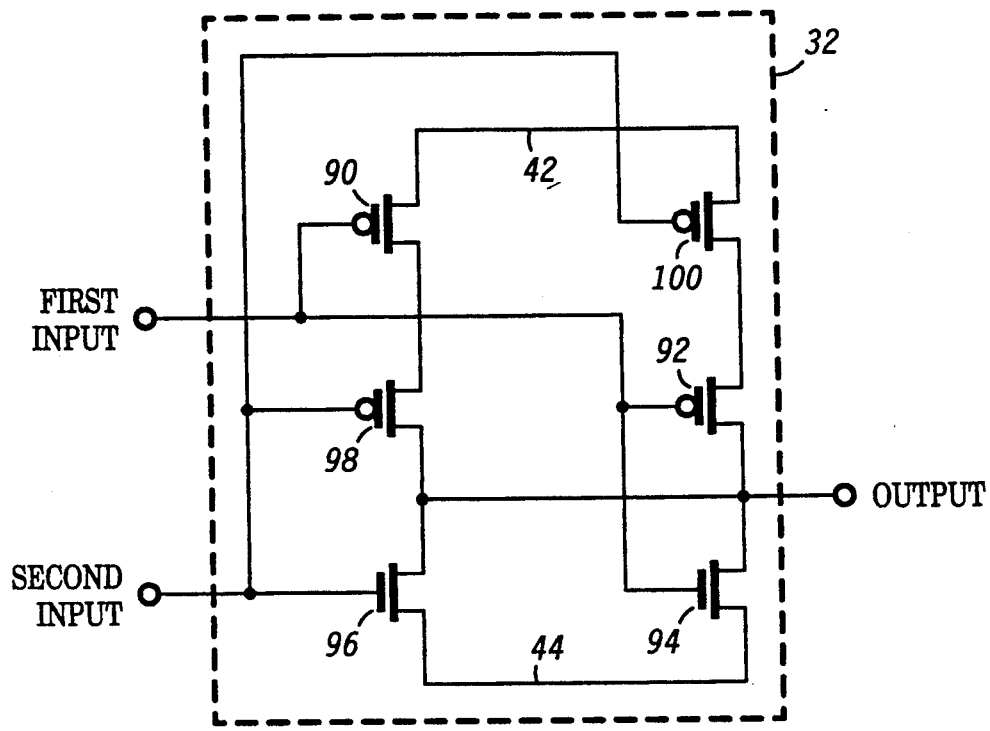
FIG. 2 is an illustration of a NOR gate of the present invention.

Turning to FIG. 2, the details of NOR gate 32 are shown including first and second input terminals and an output terminal. Circuit elements having a similar function are given the same reference number as FIG. 1. The first input terminal is coupled to the gates of transistors 90, 92, and 94 while the second input terminal is coupled to the gates of transistors 96, 98, and 100. The sources of transistors 90 and 100 are coupled to power supply conductor 42, while the drain of transistor 90 is coupled to the source of transistor 98, and the drain of transistor 100 is coupled to the source of transistor 92. The drains of transistors 92, 94, 96, and 98 are all coupled together to the output terminal, while the sources of transistors 94 and 97 are coupled together to power supply conductor 44. The operation of NOR gate 32 follows the conventional logical NOR behavior. When the signals applied at the first and second input terminals are logic zero, transistors 90, 92, 98, and 100 are conducting pulling the output terminal toward $V_{CC}$ at power supply conductor 42. If a logic one appears at either the first or second input terminal, transistor 94 or transistor 96, or both are conducting while transistors 90-92 and/or transistors 98-100 are turned off pulling the output terminal toward the ground potential at power supply conductor 44. NOR gates 48, 60 and 72 follow a similar construction.

Figure 3:
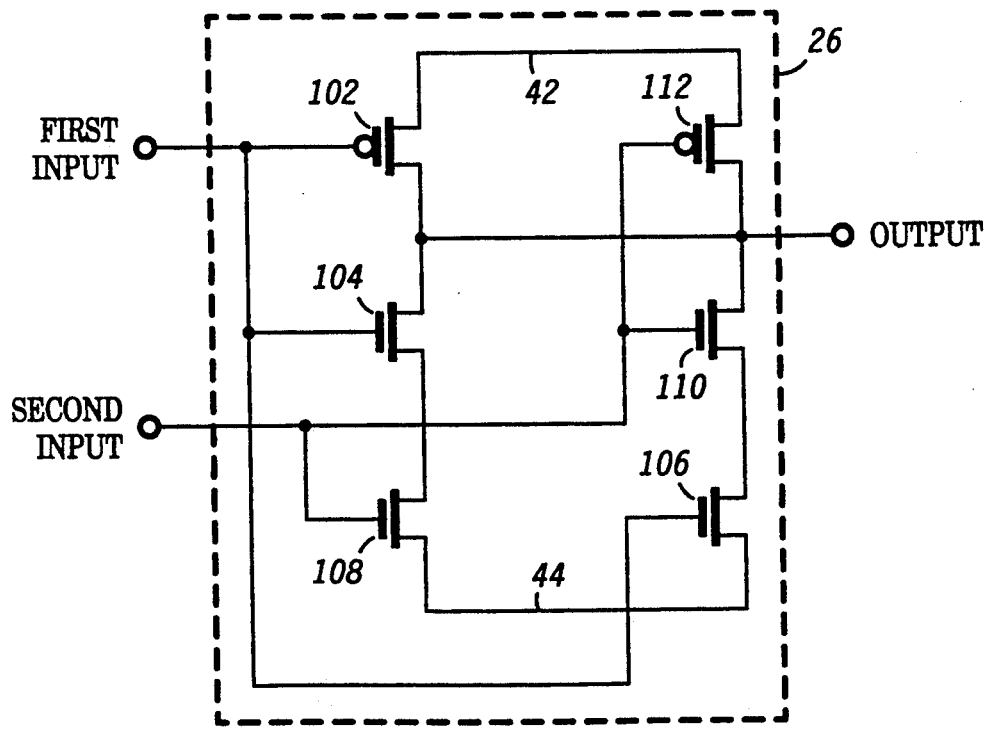
FIG. 3 is an illustration of a NAND gate of the present invention.

Further detail of NAND gate 26 is shown in FIG. 3 wherein the first input terminal is coupled to the gates of transistors 102, 104, and 106, while the second input terminal is coupled to the gates of transistors 108, 110, and 112. The sources of transistors 102 and 112 are coupled to power supply conductor 42 while the drains of transistors 102, 104, 110 and 112 are all coupled together to the output terminal. The sources of transistors 104 and 110 are respectively coupled to the drains of transistors 108 and 106 while the source of the latter two are coupled to power supply conductor 44. If a logic zero appears at the first and/or second input terminal, then the output terminal is pulled high through transistor 102 or transistor 112, or both. Alternately, if logic ones appear at the first and second input terminals, then transistors 104, 106, 108 and 110 are conducting and the output terminal is pulled toward ground potential at power supply conductor 44. For the latter case, transistors 102 and 112 are disabled. NAND gates 46, 58 and 70 follow a similar construction.

Hence, what has been described is a CMOS multiplexing circuit having four transistors in the conduction paths of each processing channel for decreasing data path and select path propagation delays wherein only one processing channel is enabled for reducing the capacitive load on the output terminal. The digital select signal activates the two transistors coupled to the output terminal in the selected processing channel while the input signal enables one of the remaining two transistors whereby the output terminal is driven to the opposite state of the input signal.

We claim:

1. A multiplexer circuit for selecting one of a plurality of input signals under control of a digital select signal and having an output for providing an output signal inverted with respect to the selected input signal, comprising:
   a plurality of processing channels each having exactly first, second, third and fourth transistors serially coupled between first and second sources of operating potential, said first transistor being coupled to said first source of operating potential, said second transistor being coupled between said first transistor and the output, said third transistor being coupled to the output, said fourth transistor being coupled between said third transistor and said second source of operating potential, said first and fourth transistors and being alternately enabled by one of the plurality of input signals; and
   selector means responsive to the digital select signal and having a plurality of outputs for providing a plurality of output signals which enable said second and third transistors of one of said plurality of processing channels while disabling said second and third transistors of the other ones of said plurality of processing channels.

2. The multiplexer circuit of claim 1 wherein said first transistor of said one of said plurality of processing channels includes a gate, a drain and a source, said source being coupled to said first source of operating potential, said gate being responsive to said one of the plurality of input signals.

3. The multiplexer circuit of claim 2 wherein said second transistor of said one of said plurality of processing channels includes a gate, a drain and a source, said source being coupled to said drain of said first transistor, said drain being coupled to the output, said gate being coupled for receiving a first one of said plurality of output signals of said selector means.

4. The multiplexer circuit of claim 3 wherein said third transistor of said one of said plurality of processing channels includes a gate, a drain and a source, said drain being coupled to the output, said gate being coupled for receiving a second one of said plurality of output signals of said selector means.

5. The multiplexer circuit of claim 4 wherein said fourth transistor of said one of said plurality of processing channels includes a gate, a drain and a source, said drain being coupled to said source of said third transistor, said source being coupled to said second source of operating potential, said gate being coupled for receiving said one of the plurality of input signals.

6. The multiplexer circuit of claim 5 wherein said selector means includes
   a NAND gate having first and second inputs and an output, said first input being coupled for receiving a first bit of the digital select signal, said second input being coupled for receiving a second bit of the digital select signal, said output being coupled to said gate of said second transistor; and
   a NOR gate having first and second inputs and an output, said first input being coupled for receiving the inverse of the first bit of the digital select signal, said second input being coupled for receiving the inverse of the second bit of the digital select signal, said output being coupled to said gate of said third transistor.

7. The multiplexer circuit of claim 6 wherein said source of said third transistor is coupled to said source of said second transistor.

8. The multiplexer circuit of claim 7 wherein said NOR gate includes:
   a fifth transistor having a gate, a drain and a source, said source being coupled to said first source of operating potential, said gate being coupled to said first input of said NOR gate;
   a sixth transistor having a gate, a drain and a source, said source being coupled to said first source of operating potential, said gate being coupled to said second input of said NOR gate;
   a seventh transistor having a gate, a drain and a source, said source being coupled to said drain of said fifth transistor, said gate being coupled to said second input of said NOR gate, said drain being coupled to said output of said NOR gate;
   an eighth transistor having a gate, a drain and a source, said source being coupled to said drain of said sixth transistor, said gate being coupled to said first input of said NOR gate, said drain being coupled to said output of said NOR gate;
   a ninth transistor having a gate, a drain and a source, said drain being coupled to said output of said NOR gate, said gate being coupled to said second input of said NOR gate, said source being coupled to said second source of operating potential; and
   a tenth transistor having a gate, a drain and a source, said drain being coupled to said output of said NOR gate, said gate being coupled to said first input of said NOR gate, said source being coupled to said second source of operating potential.

9. The multiplexer circuit of claim 8 wherein said NAND gate includes:
   an eleventh transistor having a gate, a drain and a source, said source being coupled to said first source of operating potential, said gate being coupled to said first input of said NAND gate, said drain being coupled to said output of said NAND gate;

a twelfth transistor having a gate, a drain and a source, said source being coupled to said first source of operating potential, said gate being coupled to said second input of said NAND gate, said drain being coupled to said output of said NAND gate;

a thirteenth transistor having a gate, a drain and a source, said drain being coupled to said drain of said eleventh transistor, said gate being coupled to said first input of said NAND gate;

a fourteenth transistor having a gate, a drain and a source, said drain being coupled to said output of said NAND gate, said gate being coupled to said second input of said NAND gate;

a fifteenth transistor having a gate, a drain and a source, said drain being coupled said gate being coupled to said second input of said NAND gate, said source being coupled to said second source of operating potential; and a sixteenth transistor having a gate, a drain and a source, said drain being coupled to said source of said fourteenth transistor, said gate being coupled to said first input of said NAND gate, said source being coupled to said second source of operating potential.

10. A multiplexer circuit for selecting one of a plurality of input signals under control of a digital select signal and having an output for providing an output signal inverted with respect to the selected input signal, comprising:
  a plurality of processing channels one for each input signal wherein each processing channel includes,
    (a) a first transistor having a gate, a drain and a source, said source being coupled to a first source of operating potential, said gate being coupled for receiving a first one of the plurality of input signals,
    (b) a second transistor having a gate, a drain and a source, said source being coupled to said drain of said first transistor, said drain being coupled to the output,
    (c) a third transistor having a gate, a drain and a source, said drain being coupled to the output, and
    (d) a fourth transistor having a gate, a drain and a source, said drain being coupled to said source of said third transistor, said source being coupled to a second source of operating potential, said gate being coupled for receiving the first one of the plurality of input signals; and
  selector means having a first plurality of outputs respectively coupled to said gates of said second transistors of said plurality of processing channels and a second plurality of output respectively coupled to said gates of said third transistors of said plurality of processing channels, said selector means being responsive to the digital select signal for providing the logic states of said first and second plurality of outputs such that said second and third transistors of one of said plurality of processing channels are conducting while said second and third transistors of the other ones of said plurality of processing channels are non-conducting.

11. The multiplexer circuit of claim 10 wherein said selector means includes:

a NAND gate having first and second inputs and an output, said first input being coupled for receiving a first bit of the digital select signal, said second input being coupled for receiving a second bit of the digital select signal, said output being coupled to said gate of said second transistor; and a NOR gate having first and second inputs and an output, said first input being coupled for receiving the inverse of the first bit of the digital select signal, said second input being coupled for receiving the inverse of the second bit of the digital select signals, said output being coupled to said gate of said third transistor.

12. The multiplexer circuit of claim 11 wherein said source of said third transistor is coupled to said source of said second transistor.

13. The multiplexer circuit of claim 12 wherein said NOR gate includes:

a fifth transistor having a gate, a drain and a source, said source being coupled to said first source of operating potential, said gate being coupled to said first input of said NOR gate;

a sixth transistor having a gate, a drain and a source, said source being coupled to said first source of operating potential, said gate being coupled to said second input of said NOR gate;

a seventh transistor having a gate, a drain and a source, said source being coupled to said drain of said fifth transistor, said gate being coupled to said second input of said NOR gate, said drain being coupled to said output of said NOR gate;

a eighth transistor having a gate, a drain and a source, said source being coupled to said drain of said sixth transistor, said gate being coupled to said first input of said NOR gate, said drain being coupled to said output of said NOR gate;

a ninth transistor having a gate, a drain and a source, said drain being coupled to said output of said NOR gate, said gate being coupled to said second input of said NOR gate, said source being coupled to said second source of operating potential; and a tenth transistor having a gate, a drain and a source, said drain being coupled to said output of said NOR gate, said gate being coupled to said first input of said NOR gate, said source being coupled to said second source of operating potential.

14. The multiplexer circuit of claim 13 wherein said NAND gate includes:

an eleventh transistor having a gate, a drain and a source, said source being coupled to said first source of operating potential, said gate being coupled to said first input of said NAND gate, said drain being coupled to said output of said NAND gate;

a twelfth transistor having a gate, a drain and a source, said source being coupled to said first source of operating potential, said gate being coupled to said second input of said NAND gate, said drain being coupled to said output of said NAND gate;

a thirteenth transistor having a gate, a drain and a source, said drain being coupled to said drain of said eleventh transistor, said gate being coupled to said first input of said NAND gate;

a fourteenth transistor having a gate, a drain and a source, said drain being coupled to said output of said NAND gate, said gate being coupled to said second input of said NAND gate;

a fifteenth transistor having a gate, a drain and a source, said drain being coupled said gate being coupled to said second input of said NAND gate, said source being coupled to said second source of operating potential; and a sixteenth transistor having a gate, a drain and a source, said drain being coupled to said source of said fourteenth transistor, said gate being coupled to said first of said NAND gate, said source being coupled to said second source of operating potential.

15. An integrated multiplexer circuit for selecting one of a plurality of input signals under control of a digital select signal and having an output for providing an output signal inverted with respect to the selected input signal, comprising:

a plurality of processing channels each having exactly first, second, third and fourth transistors serially coupled between first and second sources of operating potential, said first transistor being coupled to said first source of operating potential, said second transistor being coupled between said first transistor and the output, said third transistor being coupled to the output, said fourth transistor being coupled between said third transistor and said second source of operating potential, said first and fourth transistors being alternately enabled by one of the plurality of input signals; and selector means responsive to the digital select signal and having a plurality of outputs for providing a plurality of output signals which enable said second and third transistors of one of said plurality of processing channels while disabling said second and third transistors of the other ones of said plurality of processing channels.

16. The multiplexer circuit of claim 15 wherein said first transistor of said one of said plurality of processing channels includes a gate, a drain and a source, said source being coupled to said first source of operating potential, said gate being responsive to said one of the plurality of input signals.

17. The multiplexer circuit of claim 15 wherein said second transistor of said one of said plurality of processing channels includes a gate, a drain and a source, said source being coupled to said drain of said first transistor, said drain being coupled to the output, said gate being coupled for receiving a first one of said plurality of output signals of said selector means.

18. The multiplexer circuit of claim 17 wherein said third transistor of said one of said plurality of processing channels includes a gate, a drain and a source, said drain being coupled to the output, said gate being coupled for receiving a second one of said plurality of outputs signals of said selector means.

19. The multiplexer circuit of claim 18 wherein said fourth transistor of said one of said plurality of processing channels includes a gate, a drain and a source, said drain being coupled to said source of said third transistor, said source being coupled to said second source of operating potential, said gate being coupled for receiving said one of the plurality of input signals.

20. The multiplexer circuit of claim 1 wherein said selector means includes:

a NAND gate having first and second inputs and an output, said first input being coupled for receiving a first bit of the digital select signal, said second input being coupled for receiving a second bit of the digital select signal, said output being coupled to said gate of said second transistor; and a NOR gate having first and second inputs and an output, said first input being coupled for receiving the inverse of the first bit of the digital select signal, said second input being coupled for receiving the inverse of the second bit of the digital select signal, said output being coupled to said gate of said third transistor.

* * * * *